Figure 1:
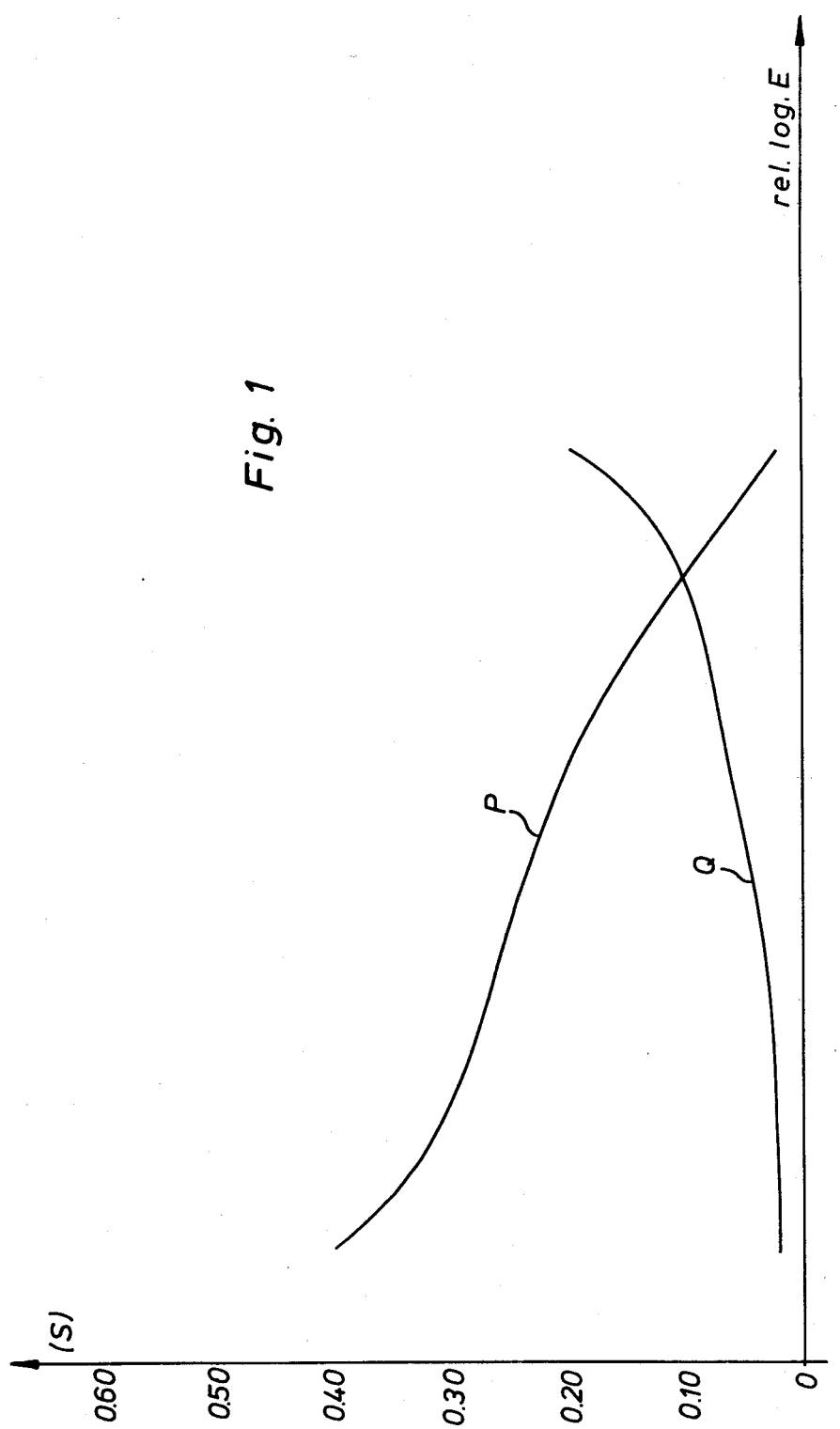

United States Patent [19]

Vermeulen et al.

[11] 4,144,064
[45] Mar. 13, 1979

[54] PHOTOGRAPHIC MATERIAL FOR USE IN THE SILVER COMPLEX DIFFUSION TRANSFER PROCESS

[75] Inventors: Leon L. Vermeulen, Broechem; Ludovicus M. Mertens, Borgerhout, both of Belgium

[73] Assignee: AGFA-GEVAERT N.V., Mortsel, Belgium

[21] Appl. No.: 836,412

[22] Filed: Sep. 26, 1977

[51] Int. Cl.$^2$ .................... G03C 5/54; G03C 1/48; G03C 1/84

[52] U.S. Cl. .................... 96/29 L; 96/29 R; 96/76 R; 96/84 R

[58] Field of Search ............. 96/29 L, 29 R, 45, 84 R, 96/76 R, 87 R, 33

[56] References Cited

U.S. PATENT DOCUMENTS

| 3,091,535 | 5/1963 | Milner | 96/87 R |
| 3,629,054 | 12/1971 | Dekeyser et al. | 96/76 R |
| 3,721,559 | 3/1973 | Dehaes et al. | 96/29 L |
| 3,904,412 | 9/1975 | Serrien et al. | 96/29 L |
| 3,976,487 | 8/1976 | Kubotera et al. | 96/29 L |

Primary Examiner—Richard L. Schilling
Attorney, Agent, or Firm—William J. Daniel

[57] ABSTRACT

A photographic material for reproduction especially of continuous tone originals by the silver complex diffusion transfer process comprising in order:

(1) a silver halide emulsion layer,
(2) a layer reflecting white light having a dry coating weight in the range of 5 g/sq.m to 20 g/sq.m and dispersed in an organic hydrophilic colloid binder white inorganic pigment particles in such an amount that such layer has a diffuse transmission density of 0.30 to 0.50 and a reflection density of 0.15 to 0.20,
(3) a subbing layer,
(4) a hydrophobic transparent film support,
(5) a subbing layer, and
(6) an antihalation layer having a dry coating weight in the range of 4 g/sq.m to 15 g/sq.m and containing dispersed in an organic hydrophilic colloid binder a non-bleachable black antihalation material in such an amount that such layer has a diffuse transmission density of at least 2.

3 Claims, 3 Drawing Figures

PHOTOGRAPHIC MATERIAL FOR USE IN THE SILVER COMPLEX DIFFUSION TRANSFER PROCESS

The present invention relates to a photographic material suitable for use in the silver complex diffusion transfer (DTR) process.

In photomechanical colour reproduction the information content of the coloured original is split up into colour separations, which are used to prepare the proper intermediate prints that serve as exposure modulators in the exposure of the photosensitive resist composition of the printing forms.

The light-sensitive material used in the production of these colour separations is commonly a panchromatic silver halide emlusion material. An essential step in the photomechanical reproduction process is the screening of the separations to transform the tone values of a continous tone record in a variety of black dots, whose area is related to the continuous tone value.

As is known to those skilled in the art, screened separations are used in the exposure of a photoresist material to produce halftone printing plates, which are used to print with a cyan, magenta, yellow and optionally black ink respectively.

Simplified methods for screening continuous tone images have become available. These methods involve the use of socalled contact screens. Such screens are used to produce screened positives from continuous tone negatives but are likewise used for the preparation of direct screen separations from colour transparencies. Years ago, the production of direct screen separations was not much used in practice for the main reason that it has not been possible to obtain sufficiently good tone rendition and colour saturation. Nowadays direct halftone colour separations are made on panchromatic lith-films with recommended colour separation filters (see Ewald Fred Noemer, The Handbook of Modern Halftone Photography (1965) published by Perfect-Graphic-Arts Supply Company P.O. Box 62 Demarest, N.Y. 07627, page 94).

The processing of halftone images in regular lith developers requires a lot of care and an investment in automatic film processors is often required to ensure high quality work. Therefore it would be advantageous to have available a direct-screening system in which halftone separation positives could be obtained from optionally premasked colour originals in one single step and with a processing system that is rather inexpensive, simple and convenient. The silver complex diffusion transfer process (DTR-process) offers such advantages but one cannot use any photographic silver halide material to obtain therewith the desired speed, screen dot quality and exposure latitude required in the production of screened images.

In order to meet the high quality demands of screened colour separations with regard to screen dot definition and tonal reproduction some measures for ensuring dot sharpness and sufficient exposure latitude have to be taken. For example the very high sharpness requirement calls for a strong reduction of light scattering and counteraction of so-called halation by light reflection at the support.

According to United States Patent Specification No. 3,091,535 of Clifford E. Milner, Jr. issued May 28, 1963 which does not deal with the DTR-process, bleachable antihalation dyes and pigments for improving the image resolution have been used in translucent lith films.

The use of a bleachable antihalation substance is a conditio sine qua non for this film material since the overall colouration due to that substance masks the silver image, which has to be viewed against the white background of the translucent layer of said material.

In the United States Patent Specification No. 3,629,054 of Lodewijk Felix De Keyser, Joseph Antoine Herbots and Julius Thiers, issued Dec. 21, 1971 a silver halide emulsion material for use in the DTR-process has been described which comprises a composite film support consisting of a black-pigmented hydrophobic layer and a white-pigmented hydrophobic layer. The material contains in order a gelatin silver halide emulsion layer, a gelatin subbing layer, a plasticized hydrophobic cellulose triacetate layer containing titanium dioxide and a hydrophobic cellulose triacetate layer containing carbon black. The purpose of the layer containing carbon black is to protect the light-sensitive silver halide emulsion layer against actinic environmental light while carrying out the diffusion transfer process under daylight conditions when the light-sensitive material with its emulsion side in contact with an opaque image-receiving material leaves the camera. Since the white titanium dioxide layer during the exposure offers an image-wise light reflection into the silver halide emulsion layer an increase in speed is obtained.

The incorporation of white and black pigments in their respective hydrophobic layers, however, poses serious problems with regard to brittleness and a sufficient pigment content.

In accordance with the present invention a photographic silver halide emulsion material is provided, which is suited for the production of halftone images of high quality with the DTR-process.

The photographic material according to the present invention comprises successively:

(1) a silver halide emulsion layer,
(2) a layer reflecting white light having a dry coating weight in the range of 5 g/sq.m to 20 g/sq.m and containing in an organic hydrophilic colloid binder white inorganic pigment particles in such an amount that said layer has a diffuse transmission density of 0.30 to 0.50 and a reflection density of 0.15 to 0.20,
(3) a subbing layer,
(4) a hydrophobic transparent film support,
(5) a subbing layer, and
(6) an antihalation layer having a dry coating weight in the range of 4 g/sq.m to 15 g/sq.m and containing dispersed in an organic hydrophilic colloid binder a non-bleachable black antihalation substance in such an amount that said layer has a diffuse transmission density of at least 2.

The "diffuse transmission density" is measured according to the requirements of American Standard PH 2. 19-1959.

By "reflection density" is meant "diffuse reflection density" which is measured according to the requirements of American Standard PH 2.17-1958.

According to a modified embodiment, the antihalation layer mentioned under (6) is present immediately under the layer (2) reflecting white light, and the subbing layer (5) is covered with a clear coating on the basis of an organic hydrophilic colloid e.g. gelatin, which coating is intended as anti-curling layer.

The thickness of the pigment layer reflecting white light preferably in the range of 3 to 6 μm (micron), e.g. is 4 μm.

The thickness of the black pigment layer is preferably in the range of 10 to 20 μm e.g. 15 μm.

As white inorganic pigment particles titanium dioxides, which may be various crystalline forms, are preferably used. The rutile crystalline form gives the highest opacity for a given weight. However, not only pure titanium dioxides but likewise so-called coated titanium dioxide pigment particles may be used. The latter means that the white titanium dioxide pigment has been modified by precipitation thereon, of e.g., hydrated aluminium oxide or of hydrated aluminium oxide together with hydrated silicon dioxide as described, e.g., in the United States Patent Specification No. 3,928,037 of Louis Maria De Haes, issued Dec. 23, 1975.

The titanium dioxide particles of the layer reflecting white light have preferably an average grain size in the range of 50 to 500 nm and are used preferably in the range of 100 % to 200 % by weight with respect to the hydrophilic binder. The hydrophilic binder may be any organic hydrophilic colloid that can form a water-permeable layer but is preferably gelatin. Mixtures of gelatin with carboxymethylcellulose are very useful.

The dispersed non-bleachable antihalation substance is preferably carbon black e.g. lampblack that has preferably an average grain size in the range of 10 to 50 nm and is used preferably in the range of 5 to 40 % by weight with respect to the hydrophilic binder.

The support of the photographic material may be any conventional transparent hydrophobic film consisting, e.g., of a cellulose ester (e.g. cellulose triacetate, cellulose nitrate, cellulose acetate butyrate), a vinyl polymer (e.g. polystyrene and copolymers of styrene) or a polyester, preferably a highly polymeric linear polyester of a dicarboxylic acid with a dihydric alcohol (e.g. polyethylene terephthalate). These supports in the present invention are provided at both sides with a subbing layer to improve the adherence of the hydrophilic binder-pigment coatings.

Suitable subbing layers for that purpose are described, e.g., in the United States Patent Specifications No. 3,495,984 of Johannes Camiel Vanpoecke, Lodewijk Felix De Keyser and Andre Jan Conix, 3,495,985 of Lodewijk Felix De Keyser, Andre Jan Conix and Joseph Antoine Herbots, both issued Feb. 17, 1970, 3,343,840 of Lodewijk Felix De Keyser, Andre Jan Conix and Lodewijk August Van Dessel, issued Mar. 25, 1969, 3,788,856 of August Jean Van Paesschen, Lucien Janbaptist Van Gossum and Jan Josef Priem, issued Jan. 29, 1974 and United Kingdom Patent Specification No. 1,234,755 filed Sept. 28, 1967 by Gevaert-Agfa N.V.

The thickness of the transparent support is preferably in the range of 0.05 mm to 0.2 mm.

Any type of negatively and positively working silver halide is suitable for preparing the emulsion layer, provided the silver halide grains are capable of being developed and complexed in the exposed and non-exposed areas respectively with the rapidity required in diffusion transfer processes.

Direct-positive silver halide emulsions can be used comprising silver halide grains that have been fogged, before or after coating of the emulsion on a support, by an overall exposure to actinic radiation or preferably by chemical fogging e.g. by means of reducing agents. Upon image-wise exposure of the prefogged emulsions, the development centres formed by such fogging are destroyed at the exposed areas and remain at the unexposed areas. By subsequent development a direct-positive image is formed. Particularly suitable direct-positive emulsions are those comprising electron-traps e.g. compounds acting as electron-acceptors or desensitizers such as desensitizing dyes which are adsorbed to the surface of the fogged silver halide grains. Other favourable direct-positive emulsions are those comprising silver halide grains containing internal centres promoting the deposition of photlytic silver formed physically or chemically during precipitation of the silver halide grains. These centres form the electron-traps. Fogging of the silver halide grains containing electron-traps in their interior or electron-acceptors at their surface preferably occurs by reduction and gold fogging, more particularly by digestion in the presence of one or more reducing agents e.g. thiourea dioxide and gold compounds e.g. potassium chloroaurate and auric trichloride or by digestion at low pAg values in the presence of gold compounds.

More details about fogged direct positive silver halide emulsions can be found in British Pat. Nos. 723,019 filed Feb. 5, 1952 by Gevaert Photo Producten N.V., 1,299,868 filed Apr. 2, 1969 by Agfa-Gevaert A.G. and 1,427,525 filed July 13, 1972 by Agfa-Gevaert N.V., in U.S. Pat. Nos. 3,367,778 of Robert W. Berriman, issued Feb. 6, 1968, 3,501,305, 3,501,306, 3,501,307, all of Bernard D. Illingsworth, issued Mar. 17, 1970, 3,501,310 of Bernard D. Illingsworth and Harry E. Spencer, issued Mar. 17, 1970, 3,531,290 of Roberta A. Litzerman, issued Sept. 29, 1970, 3,537,858 of Albert W. Wise, issued Nov. 3, 1970 and 3,963,493 of Willy Joseph Vanassche, Herman Alberik Pattyn and Hendrik Alfons Borginon issued June 15, 1976.

Another group of direct-positive silver halide emulsion materials comprises a so-called unfogged direct-positive silver halide emulsion, which has its sensitivity predominantly in the interior of the silver halide grains. Upon image-wise exposure of such emulsion a latent image forms predominantly in the interior of the silver halide grains. However, the development of such unfogged direct-positive silver halide emulsion is carried out under fogging conditions, wherein fog forms predominantly in the unexposed areas and a positive silver image results upon development. The unfogged, direct-positive silver halide emulsion material is characterized thereby that in the exposed parts no silver image is produced or only one of very poor density upon development by the use of a typical surface developer of the following composition:

| | |
|---|---|
| p-hydroxyphenylglycine | 10 g |
| sodium carbonate-1-water | 100 g |
| water up to | 1000 ml, | whereas a silver image with sufficient density forms if an internal type developer of the following composition is used:

| | |
|---|---|
| hydroquinone | 15 g |
| monomethyl-p-aminophenol sulphate | 15 g |
| anhydrous sodium sulphite | 50 g |
| potassium bromide | 10 g |
| sodium hydroxide | 25 g |
| sodium thiosulphate-5-water | 20 g |
| water up to | 1000 ml. |

The selective fogging of the image-wise exposed unfogged direct-positive emulsion materials can be carried out before or during development by a treatment with a fogging agent. Suitable fogging agents are reducing agents such as hydrazine or substituted hydrazine compounds. Reference may be made to U.S. Pat. Specification No. 3,227,552 of Keith E. Whitmore issued Jan. 4, 1966.

Unfogged direct-positive emulsions are e.g. those showing defects in the interior of the silver halide grains (ref. U.S. Patent Specification No. 2,592,250 of Edward Philip Davey and Edward Bowes Knott, issued Apr. 8, 1952) or silver halide emulsions with covered-grain structure (ref. published German Patent Application No. 2,308,239 filed Feb. 20, 1973 by Agfa-Gevaert N.V.).

The silver halide of the emulsions used according to the present invention may be any of the usual silver halides but preferably substantially consist of silver chloride e.g. at least 70 mole% of the silver halide is chloride, the remainder being preferably bromide. The average grain-size is usually in the range of 200–300 nm.

In order to obtain a spectral sensitivity over the whole visible spectrum range (panchromatic sensitivity) the silver halide is spectrally sensitized with a mixture of known methine dyes that offer in a proper ratio a spectral sensitivity as equal as possible for each wavelength between 400 and 700 nm.

The amount of spectral sensitization dyes present per mole of silver halide is e.g. from 0.10 to 60 mg.

The hydrophilic colloid used as binder medium for the silver halide is preferably gelatin.

A suitable coverage of silver halide expressed in g of silver nitrate per sq.m is in the range of 0.5 g/sq.m to 5 g/sq.m.

The present invention includes a process for the production of halftone images, which process comprises the steps of (1) photographically exposing to a light-image being a line or screened image a photographic material as defined above, (2) bringing the emulsion layer side of the exposed photographic material in contact with an image-receiving layer containing developing nuclei of an image receptor material in the presence of a liquid that makes the development of the exposed silver halide to take place and a silver halide complexing agent to effect the transfer by diffusion of silver halide complexes from the photographic material into the image-receiving layer to form a visible silver image therein, and (3) separating the exposed photographic material from the image receptor material.

In preparing a direct screen image the exposure proceeds through a contact screen and a continuous tone original.

When the receptor material contains two image receiving layers, one at each side of the support e.g. a transparent film, it does not matter which side is contacted and consequently any error that may occur in contacting the receptor material with the emulsion layer of the photographic material is avoided.

When halftone dot patterns obtained in the image receptor material by effecting the DTR-process with the photosensitive material of the present invention are examined with a magnifying glass, clear and sharp edges of the dots are observed. In comparison with conventional lith material, the obtained dot image configuration shows an improved sharpness of the dot edges.

For a same density in the dots the absolute amount of silver is considerably smaller in the images produced according to the invention than those produced in conventional lith films.

The binder of the image receiving layer containing developing nuclei in dispersed state may be any of the common hydrophilic binders used in the art, e.g. gelatin, carboxymethylcellulose, gum arabic, sodium alginate, propylene glycol ester of alginic acid, hydroxyethyl starch, dextrine, hydroxyethylcellulose, polyvinylpyrrolidone, polystyrene sulphonic acid, polyvinyl alcohol, etc.

It is preferred to use nickel sulphide nuclei or silver sulphide though other development nuclei can be used as well, e.g. sulphides of heavy metals such as sulphides of antimony, bismuth, cadmium, cobalt, lead and zinc. Other suitable salts are selenides, polyselenides, polysulphides, mercaptans and tin(II) halides. The complex salts of lead and zinc sulphides are active both alone and when mixed with thioacetamide, dithiobiuret and dithio-oxamide. Fogged silver halides can also be used as well as heavy metals themselves in colloidal form, preferably silver, gold, platinum, palladium and mercury may be used.

The image-receiving layer may be hardened so as to improve its mechanical strength. Hardening agents for colloid layers include e.g. formaldehyde, glyoxal, mucochloric acid, and chrome alum. Hardening may also be effected by incorporating a latent hardener in the colloid layer, whereby a hardener is released at the stage of applying the alkaline processing liquid.

Further information on the composition of the image-receiving layer can be found in "Photographic Silver Halide Diffusion Processes" by André Rott and Edith Weyde - The Focal Press, London and New York (1972), p. 50–65.

For carrying out the silver complex diffusion transfer process it is common practice to incorporate the developing agents into the light-sensitive silver halide emulsion layer and/or the image-receiving layer, or other water-permeable layers adjacent thereto.

In order to ensure a very good keepability, the present photosensitive material preferably does not contain a developing substance.

The DTR-processing liquid applied in the present invention is consequently preferably an alkaline liquid containing one or more developing agents and silver halide complexing compounds.

Suitable developing agents for the exposed silver halide are, e.g., hydroquinone and 1-phenyl-3-pyrazolidinone and p-monomethylaminophenol. The development or activating liquid contains in the process for forming a silver image through the silver complex diffusion transfer process a silver halide solvent, e.g., a complexing compound such as an alkali metal or ammonium thiosulphate or thiocyanate, or ammonia. Alternatively or in addition such complexing compound may be present in the image-receiving layer.

The exposure of the light-sensitive material and the diffusion transfer proceed preferably with, or in the apparatus commercially available therefor and of which several types have been described in the already mentioned book of A. Rott and E. Weyde.

The present invention is illustrated by the following example. All percentages and ratios are by weight unless otherwise stated.

EXAMPLE

Preparation of the film material A with one pigment layer containing carbon black A washed gelatino silver chlorobromide emulsion (98.2 mole of % chloride and 1.8 mole % of bromide) comprising an amount of silver halide equivalent to 150 g of silver nitrate per kg was fogged chemically by addition of potassium chloroaurate (1.2 mg per mole of silver halide) at pH 7 and pAg 6 and by keeping the emulsion at 55° C. for 3 hours.

400 mg of pinacryptol yellow and 250 mg of the following desensitizing methine dye of the 2-phenyl-indole class described in the U.S. Pat. No. 3,615,610

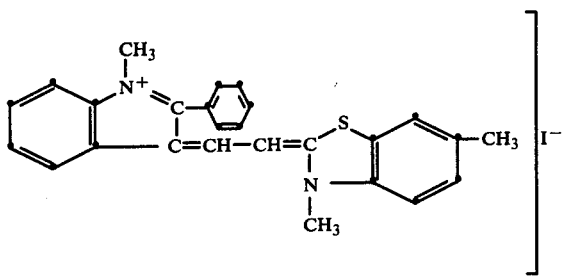

were added to the fogged emulsion.

The pH of the emulsion was lowered to 5 and the pAg raised to 9.5.

The emulsion was coated at a silver halide coverage equivalent to 2.75 g of silver nitrate and 1.9 g of gelatin per sq.m, on a black antihalation layer carried by a subbed polyethylene terephthalate film support having a thickness of 0.1 mm.

The black antihalation coating was coated from the following mixture:

| | |
|---|---|
| water | 800 ml |
| 35% aqueous dispersion of lampblack (average grain size 30 nm) | 21 g |
| gelatin | 64 g |
| 12.5% solution of saponine in a mixture of ethanol and water (80/20 by volume) | 21 ml |
| water to make | 1 l. |

The coating proceeded at a coverage of 1 liter/17.1 sq.m. The diffuse transmission density of the black antihalation layer was 2.60.

Preparation of the film material B with one pigment layer containing titanium dioxide.

The silver halide emulsion prepared as described for film material A was coated at a same coverage on a white pigment coating, which itself had been applied from the following coating composition to a subbed polyethylene terephthalate support having a thickness of 0.1 mm:

| | |
|---|---|
| water | 200 ml |
| ethanol | 110 ml |
| gelatin | 53 g |
| 16% dispersion of titanium dioxide (rutile having an average grain size of 300 nm) in an aqueous gelatin solution containing 4.3% of gelatin | 555 ml |
| 12.5% aqueous solution of saponine | 25 ml |
| water to make | 1 l. |

The coating was performed at a coverage of 1 liter/13.3 sq.m

The white pigment coating had a diffuse transmission density of 0.43 and a reflection density of 0.16. The diffuse transmission density was measured with a MACBETH Quanta-Log Densitometer Model TD-102 and the reflection density was measured with the MACBETH Quanta-Log Densitometer Model RD-219 (Quanta-Log is a tradename of Macbeth Corporation, Newburgh, N.Y. 12550 U.S.A.).

Preparation of the film material C according to the invention with one pigment layer containing titanium dioxide and one pigment layer containing carbon black.

Film material C was prepared in the same way as material B with the difference, however, that the rear side of the support was coated with a black antihalation layer from the following composition:

| | |
|---|---|
| water | 600 ml |
| 35% aqueous dispersion of lampblack (average grain size 30 nm) | 27 g |
| gelatin | 100 g |
| ethanol | 73 ml |
| 12.5% aqueous solution of saponine | 13.5 ml |
| 4% aqueous solution of formaldehyde | 11 ml |
| water to make | 1 l. |

The coating was performed at a coverage of 1 liter/14.5 sq.m.

The diffuse transmission density of the black antihalation layer was 3.00.

These film materials were used under the same conditions in the DTR-process in combination with an image-receiving material prepared by coating a subbed polyethylene terephthalate film with the following coating composition:

| | |
|---|---|
| water | 800 ml |
| gelatin | 62 g |
| aqueous dispersion of 0.20% of colloidal silver sulphide and 11.6% of gelatin | 33 ml |
| 12.5% solution of saponine in a mixture of ethanol and water 80/20 by volume | 35 ml |
| 20% aqueous formaldehyde solution | 10 ml |
| water to make | 1 l |

The coating was performed in such a way that after drying at 50° C. a layer having a dry weight of 54.3 g per sq.m was obtained.

For comparative determination of the exposure latitude of the above materials A, B, and C these materials were exposed in contact under the same conditions through superposed wedges, one of which being a screened wedge having in superposition thereon but turned over an angle of 90° the other wedge, which is a continuous tone step wedge having a constant of 0.15.

The identically exposed materials A, B, and C were DTR-processed in contact with the above receptor material by means of a developer solution containing the following ingredients:

| | |
|---|---|
| water | 800 ml |
| sodium hydroxide | 10 g |
| hydroquinone | 10 g |
| 1-phenyl-3-pyrazolidinone | 1.5 g |
| sodium thiosulphate | 5 g |
| potassium bromide | 0.5 g |
| sodium sulphite | 50 g |
| water to make | 1 l. |

In each step area of the prints obtained the point P corresponding with 0% dot value (no dots recognizable with a magnifying glass-enlargement factor 50x) and the point Q corresponding with 100% dot value (total blackening, no screen dots separately recognizable) were determined.

Figure 2:
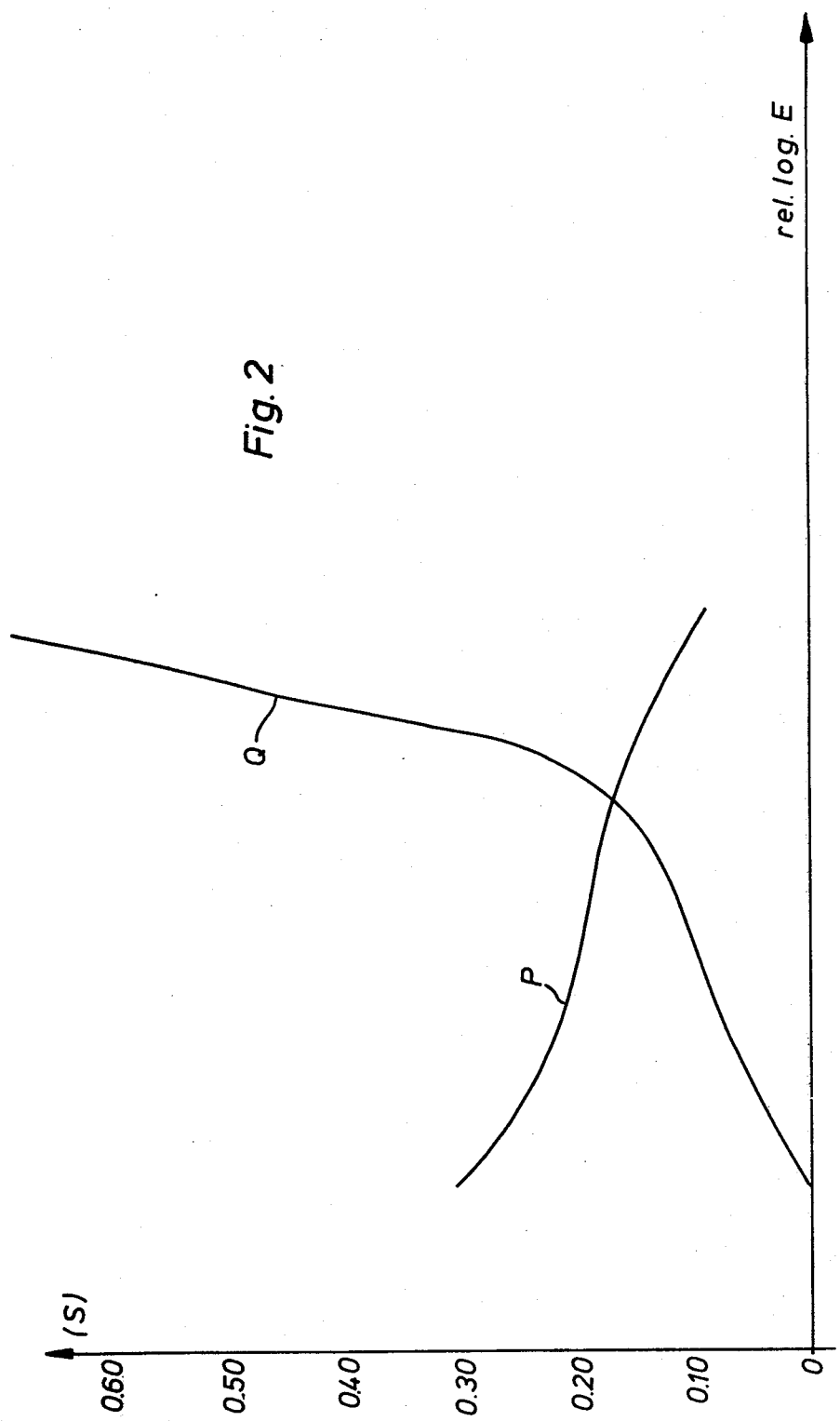
Figure 3:
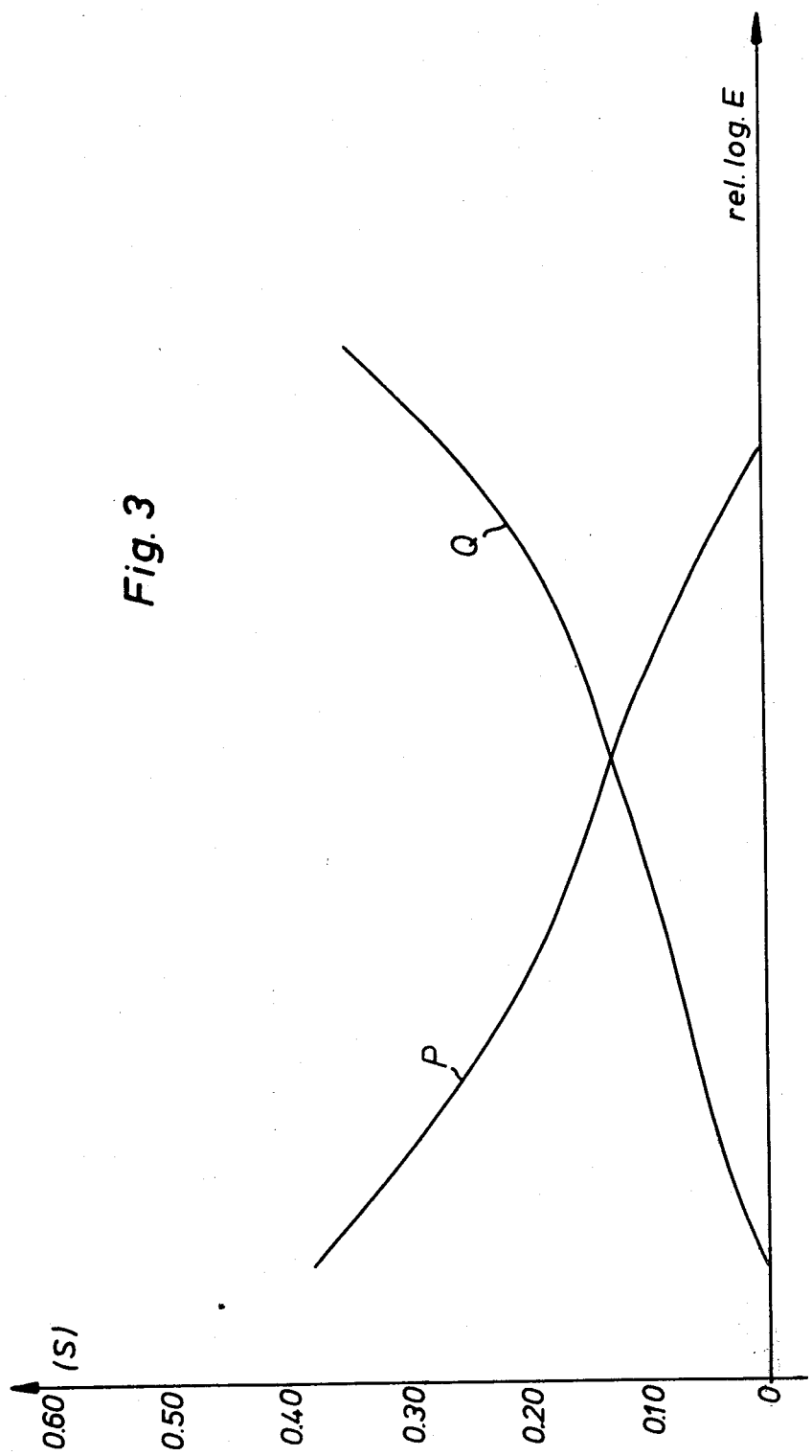

In order to illustrate the exposure latitude of said materials A, B and C the shift (S) (logarithmic values to the base 10 in the ordinate) of point P and point Q with respect to their position on the original screen wedge as a function of increasing exposure (relative log E in the absciss) is given in the accompanying FIGS. 1 to 3.

The shift (S) stands for a change of the screen range at the side of point P and Q respectively as a function of relative log exposure.

Each of the figures therefore contains two curves, one (curve P) showing the shift of point P (corresponding with 0% dot value) and one (curve Q) showing the shift of point Q (corresponding with 100% dot value) both depending on rel. log E.

From FIGS. 1, 2, and 3 relating to materials A, B, and C respectively it can be learned that material A possesses the greatest exposure latitude, that material B through its large shift of point Q has but a poor exposure latitude, and that material C according to the present invention shows an unexpected relatively low shift for both points, which makes the material particularly useful for the production of separation images according to the DTR-process.

Besides, the relative speed values of the materials A, B, and C in the present DTR-imaging have been determined at optical density 1.00. These speed values expressed as relative log values were 1.97, 1.52, and 1.55 for the materials A, B, and C respectively. The higher the log value number, the lower the speed. A decrease of 0.3 corresponds with a doubling of speed.

As a result of the high speed value of material C and of its broad exposure latitude, this material C is especially suited for camera reproduction of halftone images such as screened colour separation images.

We claim:

1. A process for the production of halftone images of an original, which process comprises the steps of:
    1. photographically exposing to a light-image which is a line or screened image of the original, a photographic material comprising in order:
        (1) a silver halide emulsion layer,
        (2) a layer reflecting white light having a dry coating weight in the range of 5 g/sq.m to 20 g/sq.m and containing in an organic hydrophilic colloid binder white inorganic pigment particles in such an amount that said layer has a diffuse transmission density of 0.30 to 0.50 and a reflection density of 0.15 to 0.20,
        (3) a subbing layer,
        (4) a hydrophobic transparent film support,
        (5) a subbing layer, and
        (6) an antihalation layer having a dry coating weight in the range of 4 g/sq.m to 15 g/sq.m and containing dispersed in an organic hydrophilic colloid binder a non-bleachable black antihalation substance in such an amount that said layer has a diffuse transmission density of at least 2, said exposure being in the direction of the side of the material carrying the silver halide emulsion layer,
    2. bringing the emulsion layer side of the exposed photographic material in contact with an image-receiving layer containing developing nuclei of an image receptor material in the presence of an aqueous alkaline liquid that makes the development of the exposed silver halide take place and of a silver halide complexing agent to effect the transfer by diffusion of silver halide complexes from the photographic material into the image-receiving layer to form a visible silver image therein, and
    3. separating the exposed photographic material from the image receptor material.

2. A process according to claim 1, wherein the exposure proceeds through a contact screen and a continuous tone original.

3. A process according to claim 1, wherein the photographic material comprises a direct-positive silver halide emulsion layer with fogged silver halide grains.

* * * * *